United States Patent [19]

Bouyer et al.

[11] Patent Number: 4,990,859
[45] Date of Patent: Feb. 5, 1991

[54] PROCESS AND APPARATUS FOR DETERMINING THE IMPEDANCE OF THE DISCHARGE IN A PLASMA REACTOR SYSTEM COMPRISING A TUNING BOX AND APPLICATION TO THE REGULATION OF THE IMPEDANCE OR THE IONIC CURRENT IN SUCH REACTOR

[75] Inventors: Bernard Bouyer, Grenoble; Bernard Andries, Thones; Guillaume Ravel, Annecy; Louise Peccoud, Claix, all of France

[73] Assignee: Commissariat a L'Energie Atomique, France

[21] Appl. No.: 370,608

[22] Filed: Jun. 23, 1989

[30] Foreign Application Priority Data

Jun. 24, 1988 [FR] France ................ 88 08514

[51] Int. Cl.⁵ ............................ G01R 27/28
[52] U.S. Cl. .................... 324/649; 324/459;
324/615; 324/711; 324/629; 422/186;
204/298.03
[58] Field of Search ............ 324/629, 638, 615, 649,
324/650, 636, 71.3, 464, 459, 468, 470, 71.1;
204/298 PS, 298 EP, 406; 422/186.04; 156/345;
118/723

[56] References Cited

U.S. PATENT DOCUMENTS 3,569,777  3/1971  Beaudry .................. 204/298 PS
4,207,137  6/1980  Tretola ..................... 204/192.33

FOREIGN PATENT DOCUMENTS 735073   5/1966  Canada ..................... 324/57 R
0064413  11/1982 European Pat. Off.
2422808  11/1975 Fed. Rep. of Germany ...... 204/298 PS
176862   8/1986  Japan ........................ 324/57 R

OTHER PUBLICATIONS

Mazza, "Automatic Impedance Matching System for RF Sputtering", IBM J. Res. Develop., vol. 14, No. 2 (Mar. 1970), pp. 192–193.
Jackson, "Electrical Characteristics of Double Electrode RF Sputtering Systems -1. The Discharge", Vacuum, vol. 21, No. 11 (Sep. 1971), pp. 533–538.
Norstrom, "Experimental and Design Information for Calculating Impedance Matching Networks for Use in RF Sputtering and Plasma Chemistry", Vacuum, vol. 29, No. 10 (Jun. 1979), pp. 341–350.
The Bell System Technical Journal, vol. 55, No. 6; Jul.-Aug. 1976, pp. 691–721; J. G. Evans et al.: "Automated Network Analyzers for the 0.9- to 12.4-GHz Range"; p. 695, point 3.1–p. 695, line 3.

Primary Examiner—Reinhard J. Eisenzopf
Assistant Examiner—Robert W. Mueller
Attorney, Agent, or Firm—Hayes, Soloway, Hennessey & Hage

[57] ABSTRACT

A method and apparatus for determining the impedance of the discharge in a plasma reactor system comprising a tuning box having variable capacitors is described. The impedance of the discharge is determined in dependence on a pre-established relationship between the operational positions of the variable capacitors on the one hand and the impedance of the discharge on the other. The ionic current relative to the discharge in the reactor also may be determined by taking into account the high frequency voltage of the reactor.

6 Claims, 2 Drawing Sheets

PROCESS AND APPARATUS FOR DETERMINING THE IMPEDANCE OF THE DISCHARGE IN A PLASMA REACTOR SYSTEM COMPRISING A TUNING BOX AND APPLICATION TO THE REGULATION OF THE IMPEDANCE OR THE IONIC CURRENT IN SUCH REACTOR

BACKGROUND OF THE INVENTION

The invention relates to a process and apparatus for determining the impedance of a discharge in a plasma reactor associated with a tuning box. It applies more particularly to the regulation of the impedance of the discharge or the ionic current in the reactor.

The invention can be used with any engraving or deposit reactor (for example, deposit by pulverization) supplied by a generator of high frequency electromagnetic waves (more simply called a high frequency generator) by means of a tuning box enabling the output impedance of the generator to be adapted to the input impedance of the reactor. The invention applies, for example, to reactors of the reactive ionic engraving type, reactors using a magnetron, those using a triode.

The term high frequency is understood to mean a frequency lower than 10 GHz (radio frequency, hyperfrequency, ... ).

The impedance of a discharge in an engraving or deposit reactor is a basic characteristic of the reactor. A knowledge of such impedance gives access to the essential characteristics of the reactor in operation, such as the ionic current (or ionic current density) and the energy of the ions. More particularly these characteristics are important when isotropic engravings are performed, which play an essential role in the production of very highly integrated circuits.

The impedance of the discharge is a complex number Z which is equal to the ratio between the sinusoidal electric voltage V existing between the terminals of the reactor during operation and the also sinusoidal intensity I of the electric current then flowing through the reactor.

Three techniques are already known for measuring the impedance of a discharge in a plasma reactor.

A first known technique consists in measuring the voltage V, the intensity I and the phase shift therebetween, while trying to eliminate the numerous harmonic components of V and I. This first known technique requires an appropriate assembly which it is difficult to use with industrial plasma reactors.

A second known technique consists in measuring or calculating the output impedance of the tuning box associated with the reactor.

This second technique is disclosed in the Article by A. J. Van ROOSMALEN entitled: "Plasma parameter estimation from RF impedance", published in Appl. Phys. Lett. 42(5), 1 March 1983, Pp. 416-418, and also in the Article by N. NORSTROM entitled: "Experimental and design information for calculating impedance matching networks for use in RF sputtering and plasma chemistry", published in Pergamon Press Vacuum, Vol. 29, No. 10, 1979, Pp. 341-350.

However, this second known technique has disadvantages: with this technique the impedance of the discharge is not measured on its own, but measurements are also made of the impedance of the link between the reactor and the tuning box and also the off-load impedance of the reactor, so that a precise analysis must be carried out of these impedances, which must be introduced into correctional formulae; moreover, the tuning box is an imperfect impedance adaptor: a proportion of the incident energy therein is lost by Joule effect or by electromagnetic radiation, something in the long run which prevents the evaluation of the stray impedances represented by the impedance of the link between the reactor and the tuning box and the off-load impedance of the reactor.

A third known technique is described in the Article by B. ANDRIES et al., entitled: "Method of electrical characterization of plasma engraving machines with capacitive coupling", published in the reports of the work of the CIPG 87 by Societe Francaise du Vide, Antibes, 1-5 June 1987, Pp. 106-109. This third known technique consists in calculating the impedance of the discharge from measurements of dispersion factors (known as "S parameters") of the tuning box connected to the turned-off pretuned reactor. The reactor is tuned when its input impedance is made equal to the impedance of the reactor supply line, such impedance generally being 50 ohms, so as to cancel out the power reflected towards the generator. These measurements are performed using a vectorial analyzer at the generator frequency, which is usually 13.56 MHz.

This third technique allows the effective calculation of the impedance Z of the discharge, by integrating the effect of all the parasite impedances, and does not necessitate a perfect tuning box—i.e., the absence of energy losses therein. However, this third known technique has disadvantages: it does not enable the impedance of the discharge to be measured in real time—i.e., continuously—when the reactor is operating (for example, during engraving). Moreover, vectorial analyzers are expensive apparatuses, and it is difficult to envisage their being permanently left on industrial reactors.

It is an object of the invention to obviate the aforementioned disadvantages by providing a process and apparatus which enable the impedance of a discharge in a plasma reactor to be determined, can be used with an industrial reactor and enable the impedance of the discharge to be determined by integrating the effect of all the parasite impedances, without assuming the absence of losses of energy in the tuning box, which do not require the immobilization of a vectorial analyzer on the reactor and, more particularly, enable the impedance Z of the discharge to be determined in real time, without disturbing the plasma.

However, it may be useful to permanently know the impedance of the discharge: in the case of the engraving of an integrated circuit, for example, the impedance varies at the end of engraving and its knowledge may enable the end of the attack of the integrated circuit to be detected; it is also known that reactors become contaminated in the course of time and that such contamination is shown by a variation in impedance, whence the advantage of knowing the impedance of the discharge, to detect such contamination; lastly, more particularly in the case of the engraving of a semiconductor wafer, it is known that the impedance of the discharge can be mathematically connected with the ionic current and with the energy of the ions in the reactor, and the permanent knowledge of the impedance of the discharge allows control of any drift in the course of time of the two parameters formed by this current and this energy, parameters which are essential for engraving.

BRIEF STATEMENT OF THE INVENTION

More precisely the invention relates in the first place to a process for determining the impedance of a discharge in a high frequency plasma reactor associated with a tuning box comprising variable capacitors, the process comprising the following stages:

the respective states of the variable capacities are determined, and the impedance of the discharge is determined in dependence on these respective states by means of a pre-established correspondence between the states liable to be adopted by the variable capacitors on the one hand and the impedance of the discharge on the other.

It is also possible to make a determination of the ionic current relative to the discharge in the reactor in dependence on the high frequency voltage applied between the terminals of the reactor, the respective states of the variable capacitors and a pre-established correspondence between the states liable to be adopted by the variable capacitors on the one hand and the impedance of the discharge on the other.

More precisely still, the ionic current is determined from the impedance of the discharge by connecting the latter by a suitable discharge model to the sheath and the plasma of the discharge. The knowledge of the impedance of the sheath and the discharge (and of the voltage applied between the terminals of the reactor) then enable the ionic current to be determined.

Discharge models are given in the Article by THOMPSON et al. entitled: "Ion bombardment energy distribution in radiofrequency glow-discharge systems", published in Appl. phys. 59(6), Mar. 15, 1986, Pp. 1890–1903 and in the Article by R. H. BRUCE, entitled: "Ion response to plasma excitation frequency", published in Appl. Phys. 52(12), December 1981, Pp. 7064–7066.

The invention also relates to an apparatus for determining the impedance of a discharge in a high frequency plasma reactor associated with a tuning box comprising variable capacitors, the apparatus comprising:

pickups adapted to supply signals representing the respective states of the variable capacitors, and electronic processing means provided to determine the impedance of the discharge by means of these signals and a pre established correspondence between the states liable to be adopted by the variable capacitors on the one hand and the impedance of the discharge on the other, such correspondence being memorized in the electronic processing means.

According to another possible feature of the invention the electronic processing means are provided to determine the ionic current relative to the discharge in the reactor by means of the high frequency voltage applied between the terminals of the reactor, signals supplied by the pickups and a pre-established correspondence between the states liable to be adopted by the variable capacitors on the one hand and the impedance of the discharge o the other, such correspondence being memorized in the electronic processing means.

Essential aspects of the present invention are therefore:

the recognition of the existence of a bijective correspondence between the states (still called "positions" hereinafter) of the variable capacitors of the tuning box and the impedance of the discharge (and possibly the ionic current relating to such discharge for a given high-frequency voltage applied between the terminals of the reactor), supposing that the impedance of the turned-off reactor is constant, whatever the regulation of the variable capacitors of the associated tuning box may be, and the use of the states of the variable capacitors of the tuning box at a given moment to determine at that moment the value of the impedance of the discharge and possibly the ionic current by means of said pre established correspondence.

Lastly, the invention relates to a system for regulating the impedance of the discharge or the ionic current in a high frequency plasma reactor supplied by a high frequency generator via a tuning box associated with automatic tuning means, the tuning box comprising variable capacitors and being provided to adapt the output impedance of the generator to the input impedance of the reactor, the automatic tuning means being provided to adjust the states of the variable capacitors of the tuning box via means for modifying such states, so as to cancel out the power reflected towards the generator, the system comprising an apparatus according to the invention, the power of the generator being capable of being controlled and the electronic processing means which the apparatus comprises also being provided so to control the power of the generator that the impedance of the discharge or the ionic current which they determine is maintained equal to a desired value.

The means for modifying the device can be motors and the capacitors are of potentiometric kind and are respectively mounted on the shafts of the motors.

LIST OF DRAWINGS

The invention will be more clearly understood from the following description of purely exemplary non-limitative embodiments thereof with reference to the accompanying drawings, wherein:

FIG. 1 is a diagrammatic view of a known system for controlling a plasma reactor, FIG. 2 is a possible electric circuit for the tuning box associated with the reactor, FIG. 3 is an assembly allowing the establishment of the aforementioned correspondence between the states of the variable capacitors of the tuning box and the impedance of the discharge in the reactor and possibly the ionic current in the reactor, FIG. 4 illustrates diagrammatically an assembly carried out on the reactor for the establishment of such correspondence.

FIG. 5 is a diagram illustrating that the tuning box can be considered to be a quadripole, that the reactor can be considered to be a dipole, and that the assembly formed by the reactor plus the tuning box can be considered to be a quadripole, FIG. 6 is a diagrammatic view of a particular embodiment of a system according to the invention for controlling a plasma reactor, and FIG. 7 is a diagram illustrating a particular pickup adapted to supply a signal representing the state of a variable capacitor of the tuning box.

DESCRIPTION OF THE PREFERRED EMBODIMENTS

Figure 1:
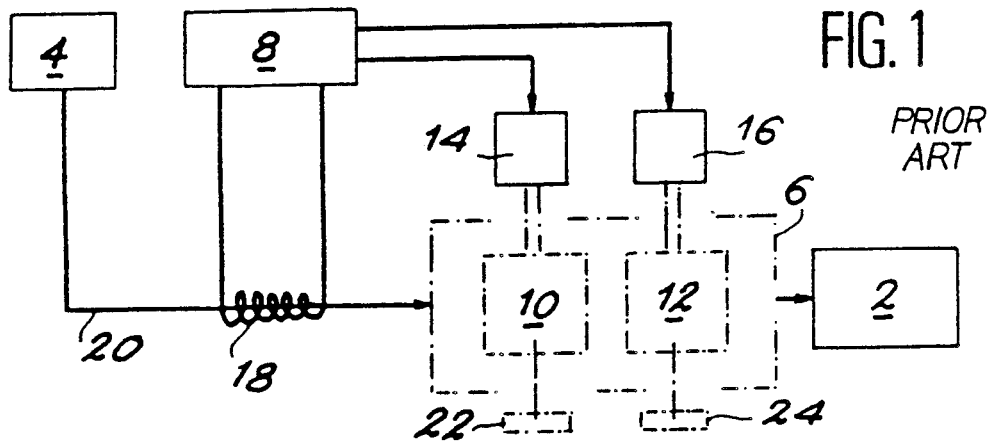

FIG. 1 shows diagrammatically a prior art system for controlling a high frequency plasma reactor 2, adapted, for example, to the engraving of semiconductor wafers. The reactor 2 is supplied by a high frequency generator 4 (a radio frequency, for example) via a tuning box 6. The system also comprises automatic tuning means 8 which are provided to permanently maintain optimum tuning between the generator and the reactor.

The tuning box 6 comprises variable capacitors 10 and 12 whose states (or positions) are produced respectively by motors 14 and 16 controlled by the automatic tuning means 8. To this end the automatic tuning means 8 use an inductive coupling 18 established between themselves and a line 20 (generally a coaxial cable) connecting the generator 4 to the tuning box 6.

FIG. 1 also shows buttons 22 and 24 enabling the positions of the variable capacitors 10 and 12 of the tuning box 6 to be respectively manually controlled to produce optimum tuning (in the absence of the automatic tuning means 8 and, for example, for preliminary trials of the reactor 2). Each capacitor comprises a movable part and a fixed part (neither shown) and the corresponding button is rigidly connected to the movable part.

Figure 2:
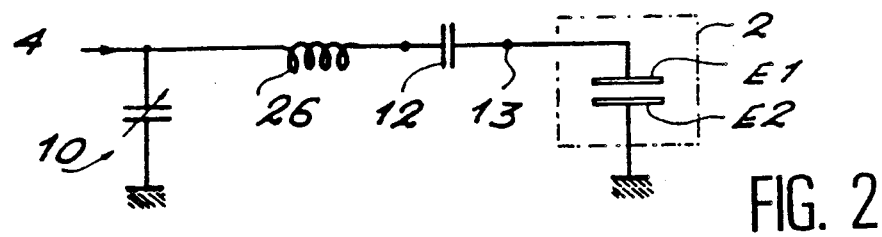

FIG. 2 shows a possible electric circuit for the tuning box 6, which comprises a variable capacitor 10 (tuning capacitor) and a variable capacitor 12 (load capacitor). One terminal of the capacitor 10 is grounded, while its other terminal is connected to the line coming from the generator (or more precisely to the core of the coaxial cable 20 whose braiding is grounded) and also to a terminal of an inductance 26 whose other terminal is connected to a terminal of the capacitor 12. The other terminal 13 of the capacitor 12 is connected to one of the two electrodes of the reactor 2, the other electrode E2 of such reactor being grounded.

The electrode E1 is the one via which the high frequency voltage is applied to make the reactor operate and serves to create the discharge therein, while the electrode E2, which is grounded, is used as a reference potential.

As already indicated hereinbefore, the existence has been shown of a bijective correspondence between (a) the respective positions p1 and p2 of the capacitors 10 and 12 in relation to a reference position and the impedance Z of the discharge in the operating reactor 2, and also (b) between such positions and the ionic current J relating to such discharge (for a given high frequency voltage applied between the terminals of the reactor). These quantities Z and J are therefore functions of the couple (p1, p2) for a fixed composition of plasma generator gas and a fixed pressure of such gas.

Figure 3:
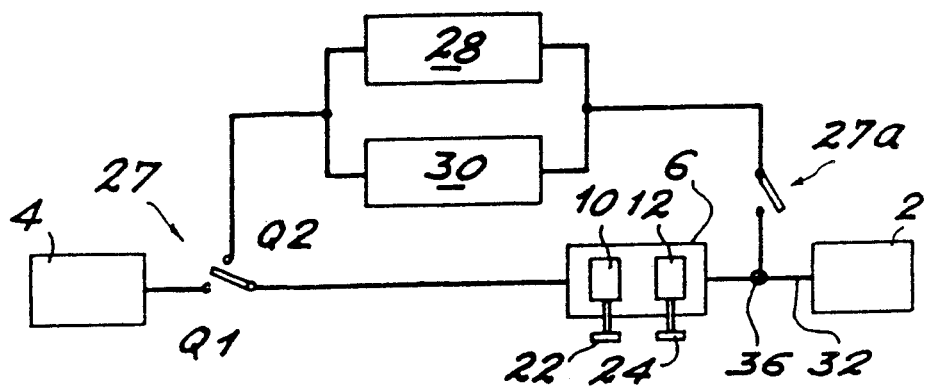

FIG. 3 illustrates diagrammatically an assembly allowing this correspondence to be established. In the assembly the generator 4 can be connected to the reactor 2 or disconnected therefrom by, for example, a switch 27 (cf. hereinafter) via which the generator 4 is connected to the tuning box 6 having buttons 22 and 24 for controlling the variable capacitors which the tuning box comprises. The buttons 22 and 24 can be controlled either manually or automatically.

In contrast, the automatic tuning means 8 and the inductive coupling 18 associated therewith are eliminated.

A vectorial analyzer 28 and a directional wattmeter 30 are mounted (only during the establishment of the correspondence) in parallel between the input and the output of the tuning box 6, via the switch 27 and another switch 27a (cf. hereinafter). The vectorial analyzer 28 and the wattmeter 30 enable Z to be determined.

The establishment of the aforementioned correspondence, for which the assembly shown in FIG. 3 is used, supposes on the one hand, as already indicated, that the impedance of the turned off reactor is constant, whatever the control of the tuning box may be and, on the other hand, that it is possible to correctly define the planes of reference of the quadripole formed by the tuning box (cf. hereinafter). The term planes of reference means the places where the vectorial analyzer and the wattmeter are connected on either side of the tuning box. More particularly the output reference plane—i.e., the place of connection of the analyzer and the wattmeter to the output of the tuning box—must be as close as possible to the terminals between which the discharge takes place, so as to take into account to the maximum extent the stray impedances mentioned hereinbefore with reference to the second known technique.

Figure 4:
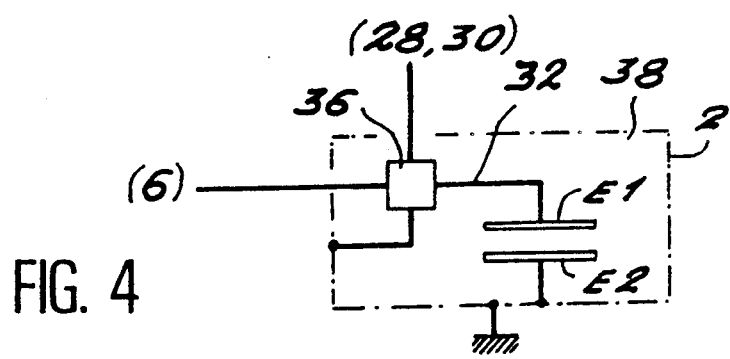

To this end use is made of a metal wire 32 (FIG. 4) which is connected on the one hand to the electrode E1 of the reactor and on the other hand to a terminal of a tapping point 36 whose other terminals are electrically connected to the tuning box and to the assembly formed by the analyzer and the wattmeter and whose screening is connected to the grounded frame 38 of the reactor. Advantageously the metal wire 32 is no longer than 30 centimeters.

FIG. 3 shows that the switch 27 has two mutually exclusive positions:

a position Q1 in which the generator 4 is connected to the tuning box, and a position Q2 in which the input of the tuning box is connected to the terminal shared by the analyzer 28 and the wattmeter 30 on the side of such input.

It can also be seen that the switch 27a is provided to connect to the appropriate terminal of the tapping place 36, or to disconnect therefrom, the terminal shared by the analyzer 28 and the wattmeter 30 on the side of the tuning box output.

For the establishment of the correspondence, therefore, the switch 27 is in the position Q2 (the generator is disconnected) and the switch 27a is closed (the switches connect the analyzer and the wattmeter to the tuning box). In contrast, when the reactor is operating (after the establishment of the correspondence), the switch 27 is in the position Q1 (the generator is connected to the tuning box) and the switch 27a is open (the analyzer and the wattemeter are not connected to the tuning box and can be removed).

Figure 5:
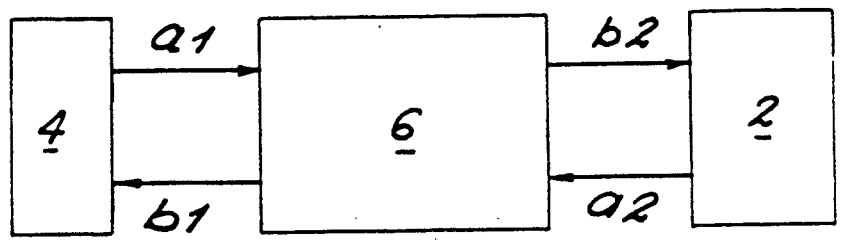

The tuning box 6 can be considered to be a quadripole (FIG. 5) and the reactor 2 a dipole, the assembly forming a quadripole. When the system formed by the reactor 2, the generator 4 and the tuning box 6 is operating, the tuning box 6 receives from the generator 4 an incident wave of amplitude a1 and reflects a wave of amplitude b1 in the direction of the generator The tuning box 6 also sends an incident wave of amplitude b2 in the direction of the reactor and receives therefrom a reflected wave of amplitude a2.

The quadripole formed by the tuning box 6 and the reactor 2 is characterized by four complex coefficients S11, S12, S21 and S22 which are known as dispersion factors and whose assembly forms what is called the dipersion matrix of the quadripole (cf. the Article by B. ANDRIES et al. mentioned hereinbefore.

Since the quadripole is made up solely of passive elements, the quantities S12 and S21 are equal.

The correspondence is established as follows: the generator being disconnected and the assembly formed by the analyzer and the wattmeter connected (switch 27 in position Q2 and switch 27a closed), the reactor therefore being turned off, the position p1 being capable of varying over a range (A1, B1) and the position p2 being capable of varying over a range (A2, B2), the values of p1 and p2 are selected in their respective ranges and accordingly the variable capacitors 10 and 12 are respectively regulated by means of the buttons 22 and 24.

The complex quantities S11, S12 and S22 are then determined by means of the vectorial analyzer and the directional wattmeter. To this end in known manner the vectorial analyzer sends a reference wave to the tuning box on a characteristic load of impedance Zc, and the assembly formed by the vectorial analyzer and the wattmeter then measures the phase shift and attenuation corresponding to the wave reflected towards the analyzer. The impedance Zc is equivalent to the characteristic impedance of the line connecting the reactor to the tuning box, such impedance generally being 50 ohms.

The reference r is also used to denote the quantity a2/b2 which forms the factor of reflection (or coefficient of reflection) of the plasma (the reactor being supposed to be operating). The impedance Z of the discharge whose real part (impedance of the plasma) and the imaginary part (impedance of the sheath of the discharge) are respectively denoted by R and $-X$. is such that:

$$Z = R - jX = Zc\,(1+r).(1-r)^{-1} \text{ with } j^2 = -1.$$

Now, when the reactor is operating, the following system of equations can be written:

$$b1 = S11.a1 + S12.a2$$

$$b2 = S21.a1 + S22.a2$$

Having regard to the fact that the quantities S12 and S21 are equal, that a2 is equal to r.b2 and that b1 is zero when the reactor is tuned, this system becomes:

$$O = S11.a1 + S12.r.b2$$

$$b2 = S12.a1 + S22.r.b2$$

This system can also be written:

$$S11.a1 + S12.r.b2 = O$$

$$S12.a1 + ((S22.r) - 1)b2 = 0 (1)$$

Since the quantities a1 and b2 of this latter system are not zero, the determinant of this latter system is zero. The result is:

$$S11.S22.r - S11 = (S12)^2 r$$

From this we deduce the value of r:

$$r = S11.(S11.S22 - (S12)^2)^{-1}$$

Measurement of the complex quantities S11, S12 and S22 therefore enables the complex quantity r to be determined and therefore the impedance Z of the discharge, and as a result the real and imaginary parts of Z. Moreover, the determination of the power output Wu enables the high frequency voltage $V_{HF}$ between the terminals of the reactor to be calculated by the formula:

$$V_{HF} = (2Wu\,(R^2 + X^2)R^{-1})^{\frac{1}{2}}$$

The power output Wu can be determined by calculation from the measurement of the power W supplied by the high frequency generator (the measurement being performed on the generator supposed to be operating in this case) and from the calculation of the efficiency $n = Wu/W$.

From this we deduce: $Wu = n.W$.

The following is the calculation of the efficiency n:

We have: $Wu = |b2|^2 - |a2|^2$
$= |b2|^2 (1 - |r|^2)$

Moreover: $W = |a1|^2 - |b1|^2$.

When the reactor is tuned, therefore, W is equal to $|a1|^2$ and the efficiency n is therefore equal to:

$$n = Wu/W = |b2/a1|^2.(1 - |r|^2).$$

However, equation (1) given hereinbefore enables us to write:

$$b2/a1 = S12/(1 - rS22).$$

There follows from this:

$$n = |S12|^2.(1 - |r|^2)/|1 - rS22|^2.$$

The efficiency n can therefore be calculated from the quantities S11, S12 and S22.

The voltage $V_{HF}$ (for a given power W) can also be determined by measurement performed directly between the terminals of the reactor (supposed in this case to be operating).

Then the ionic current J can be determined by using the CHILD LANGMUIR law. The ionic current is then equal to:

$$J = k1(V_{HF})^{3/2} X^{-2}$$

The quantity k1 is a constant which depends on the experimental conditions (the composition of the gas and the surface of the electrode connected to the generator) and amounts to 10.66 for $SF_6$ and for an electrode surface connected to the generator of 226 cm² (J, $V_{HF}$ and X being expressed in A.m$^{-2}$, volts and ohms respectively).

By using, if preferred, the law of collision discharges, the ionic current J is such that:

$$J = k2(V_{HF})^{3/2} X^{-2.5}$$

The quantity k2 is again a constant which depends on the experimental conditions and amounts to 2.67 for $SF_6$ at a pressure of 20 millitors (about 2.66 pa).

We therefore have Z and J for one couple (p1, p2). Clearly, therefore, Z and J can be determined for any couple (p1, p2), p1 being selected in the range (A1, B1) and p2 in the range (A2, B2).

The result is the required correspondence which, for a given couple (p1, p2), associates a predetermined discharge impedance Z (and an ionic current J determined for a given power W). This correspondence can, for example, be expressed in the form of a table.

In the table each of the ranges (A1, B1) and (A2, B2) is cut up into subranges, so that we have two series of values A1, ..., p1$_i$, p1$_{i+1}$, ..., B1 and A2, ..., p2$_l$, p2$_{l+1}$, ..., B2, i and l being integers. In each series the values are separated from one another by a constant pitch, such pitch being small enough to allow precise calculations. The table has a double entry and gives R and X (and therefore Z) for any couple ($pi_i$, $p2_j$). As a variant, a table can be formed which gives for any couple ($p1_i$, $p2_j$) the parameters S11, S12 and S22, these parameters enabling Z and J to be calculated (for a given W) for a given Zc, as was shown hereinbefore. Such a table can be used for learning in real time the impedance Z of the plasma and/or the ionic current J (to known J, advantageously use is made of the table given below as a variant, or some equivalent table), and possibly for the regulation of such impedance or of the ionic current in a plasma reactor, as will be shown hereinafter.

The permanent (or more simply periodic) knowledge of Z and/or J enables the development of this or these important parameters of the plasma to be followed during an engraving or depositing process. This knowledge also allows the memorization of the respective positions of the variable capacitors of the tuning box corresponding to each engraving or depositing process with a view to subsequently using such positions.

It is advantageous to maintain a constant ionic current J in the reactor in the case, for example, of the engraving of semiconductor wafers, since in that case the engraving operation is reproducible (the same results from one wafer to the next).

Figure 6:
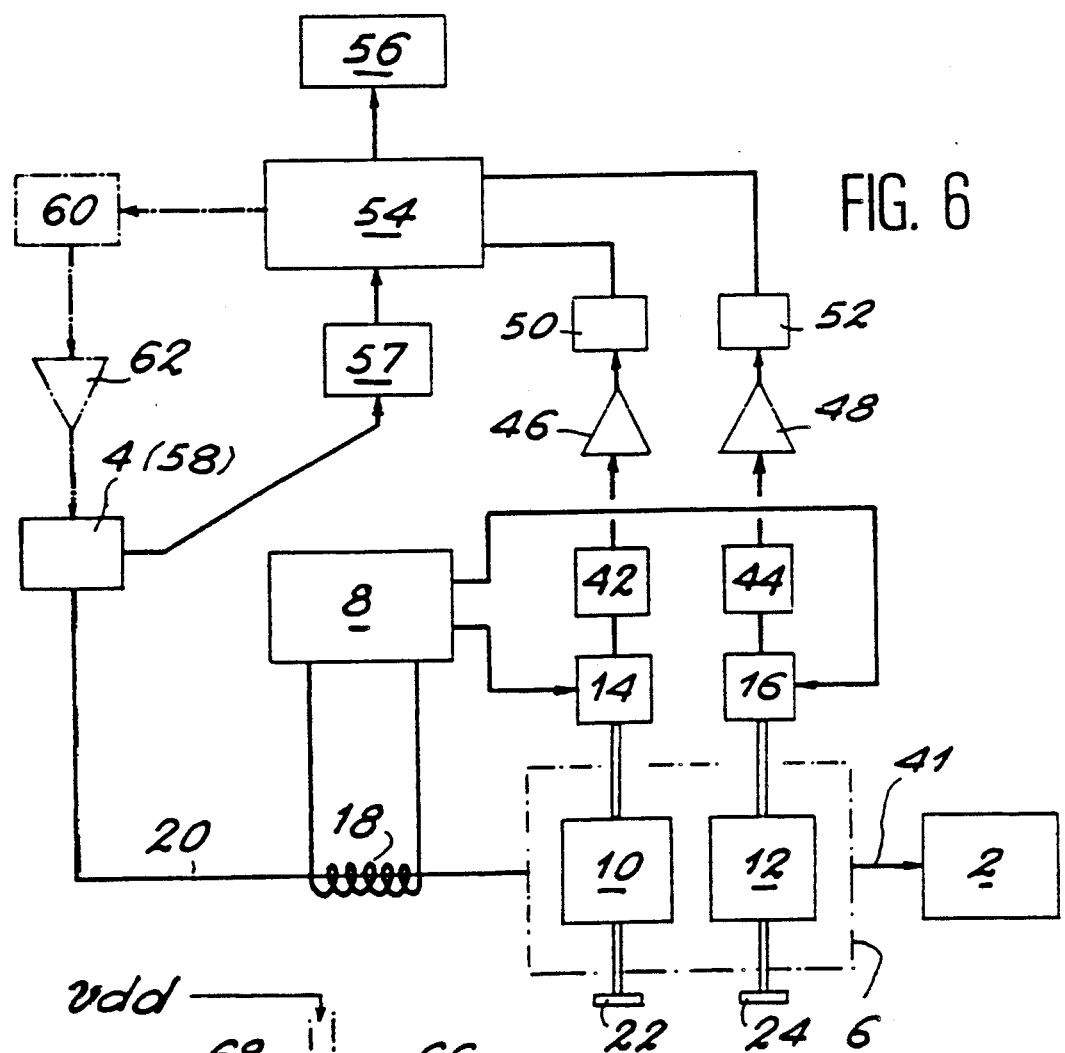

FIG. 6 shows diagrammatically a system for controlling a plasma reactor 2, the system also allowing the impedance and/or the ionic current in the operating plasma reactor to be known according to the invention on request or at any moment or periodically, for example, every second.

The system shown in FIG. 6 more particularly comprises all the elements of the system shown in FIG. 2 arranged in the same manner, the generator 4 being of regulatable power.

The line 41 connecting the tuning box to the reactor can take the form of a coaxial cable whose core connects the terminal 13 of the capacitor 12 to the electrode E1 of the reactor and whose braiding is grounded, or by means of a ribbon of metal foil connecting the terminal 13 to the electrode E1.

The system also comprises pickups 42 and 44 which are respectively associated with the variable capacitors 10 and 12 of the tuning box, as will be seen hereinafter, and which are provided to supply electric signals representing the respective positions of such capacitors 10 and 12. The signals are respectively amplified by appropriate amplifiers 46 and 48 and digitalized by analog to-digital converters 50 and 52.

The system also comprises electronic processing means 54 in which the table giving R and X is memorized (or in which Zc and the table given hereinbefore as a variant are memorized) in dependence on p1 and p2, which receive at the input the digital signals coming from the analog-to digital converters 50 and 52 and which are provided to determine the impedance Z of the discharge as a function of these signals representing positions of the capacitors of the tuning box.

The electronic processing means 54 are connected to display means 56 enabling the values of the impedance of the discharge thus determined to be displayed.

As a variant, the electronic processing means 54 can be given the value of the power W supplied by the generator 4, something which enables the electronic processing means to determine (on demand or at any moment or periodically) the ionic current J in the reactor and to display the values thus determined on the visualization means 56. In that case it is preferable to memorize in the electronic processing means the table given hereinbefore as a variant (or some equivalent table) and, of course, the aforementioned parameter k1 or k2. Moreover, the value of the power W can be supplied to the means 54 as follows: the generator comprising an output giving this value of W in analog form, this output is connected to a suitable input of the means 54 via an analog-to-digital converter 57.

If so desired, the electronic processing means can determine Z and J and display them of the visualization means 56.

In the electronic processing means, two values p1 and p2 supplied by the pickups being given, the determination of R and X (or of S11, S12, S22) which correspond to these values can be performed, for example, by a linear interpolation technique with two variables.

The system shown diagrammatically in FIG. 6 can be completed to enable J to be maintained at a constant value Jc. To this end the generator 4 is replaced by a high frequency generator 58 which can be controlled by an analog voltage. In this modified system the electronic processing means 54 are provided to determine the ionic current J in dependence on the signals supplied by the pickups 42 and 44, to compare J with a memorized desired value Jc and, if J differs from Jc, to supply a digital error signal adapted to modify the power of the generator 58. To this end the system also comprises a digital-to-analog converter 60 which receives the error signal to convert it into an analog voltage signal which is amplified by suitable amplification means 62 whose output controls the generator 58.

When J is lower than Jc, the error signal produced in the electronic processing means is provided to increase the power of the generator 58 and, conversely, when J is higher than Jc, the error signal produced in the electronic treatment means is provided to reduce the power of the generator 58.

Z can of course be kept at a desired value ZC by this system, by suitably adapting the electronic processing means 54 for them to determine Z from signals supplied by the pickups 42 and 44, the means 54 comparing Z with the memorized value ZC and, if Z differs from ZC, delivering an error signal adapted to modify the power of the generator 58 accordingly.

Figure 7:
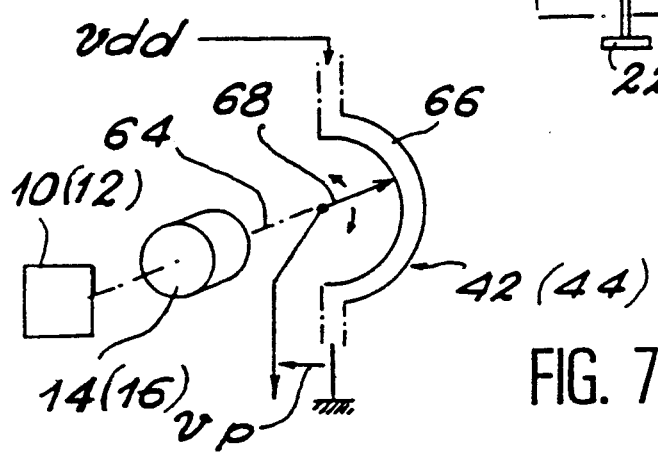

FIG. 7 shows diagrammatically a particular embodiment of the pickups 42 and 44. In this particular embodiment each pickup 42 or 44 is of the potentiometric kind: it comprises a potentiometer which is mounted on the shaft 64 of the corresponding motor. The pickup comprises an electrically resistive track 66 which is fixed in relation to the motor and disposed opposite one end of the motor shaft 64, in a plane perpendicular to such shaft 64. This end is rigidly connected to an electrically conductive cursor 68 which is provided to rub by one end on the resistive track 66. One end of the track 66 is supplied with a constant electric voltage $v_{dd}$, the other end of the track 66 being grounded. The other end of the cursor 68 thus supplies an electric voltage $v_p$ which is equal to $v_{dd}$ multiplied by a coefficient proportional to the position of the variable capacitor associated with the motor whose shaft 64 is rigidly connected to the movable part (not shown) of the variable capacitor and always rotates by the same angle as such movable part.

For the establishment of the table to be memorized, use can be made of the pickups 42 and 44 associated with the amplifiers 46 and 48 and converters 50 and 52 to return to the memory (not shown) of the electronic processing means 54 the various selected couples (p1$_i$, p2$_j$).

Of course, other position pickups can be used according to the invention: instead of the potentiometric pickups, use can be made of tacymetric dynamos, magnetic pickups, Hall effect pickups, optical pickups, mechanical pickups (with counting wheels or needles, for example), or angular detectors.

Moreover, instead of being digital, the ionic current J or the impedance Z can be controlled in analog fashion, use being made for this purpose of open loops with proportion, integral and derived action.

What is claimed is:

1. A method for determining the impedance of the discharge in a high frequency plasma reactor system comprising a tuning box having variable capacitors, the method comprising the steps of:
   (1) establishing a relationship between the operational positions of the variable capacitors on the one hand and the impedance of the discharge on the other;
   (2) determining the respective positions of the variable capacitors; and
   (3) determining the impedance of the discharge in dependence on these respective positions and by means of the established relationship.

2. A method according to claim 1, and including determining the ionic current relative to the discharge in the reactor in dependence on the high frequency voltage applied between the terminals of the reactor, the respective positions of the variable capacitors and the said established relationship.

3. An apparatus for determining the impedance of the discharge in a high frequency plasma reactor system comprising a tuning box having variable capacitors, the apparatus comprising:
   pickups for supplying signals representing the respective operational positions of the variable capacitors, and
   electronic processing means for controlling the impedance of the discharge of the signals supplied by the pickups and a pre-established relationship between the operational positions of the variable capacitors on the one hand and the impedance of the discharge on the other, such relationship being stored in the electronic processing means.

4. An apparatus for determining the impedance of the discharge in a high frequency plasma reactor system comprising a tuning box having variable capacitors, the apparatus comprising:
   pickups for supplying signals representing the respective operational positions of the variable capacitors, and
   electronic processing means for determining the ionic current relative to the discharge in the reactor by means of the high frequency voltage applied between the terminals of the reactor, the signals supplied by the pickups, and a pre-established relationship between the operational positions of the variable capacitors on the one hand and the impedance of the discharge on the other, such relationship being stored in the electronic processing means.

5. A system for regulating the impedance of the discharge of the ionic current in a high frequency plasma reactor supplied by a high frequency generator via a tuning box having automatic tuning means, the tuning box comprising variable capacitors for adapting the output impedance of the generator to the input impedance of the reactor, the automatic tuning means being adapted to adjust the positions of the variable capacitors of the tuning box so as to cancel out the power reflected towards the generator, the system comprising pickups for supplying signals representing the respective positions of the variable capacitors, and electronic processing means for controlling the impedance of the discharge by means of the signals supplied by the pickups and a pre-established relationship between the operational positions of the variable capacitors on the one hand and the impedance of the discharge on the other, such relationship being stored in the electronic processing means and being adapted to control the power of the generator such that the impedance of the discharge or the ionic current is maintained equal to a desired value.

6. A system according to claim 5, wherein the capacitors each comprise a moveable part and a fixed part, the automatic tuning means comprise motors for turning the parts of said capacitors relative to one another, and the pickups are of the potentiometric kind mounted on the shafts of the motors.

* * * * *

UNITED STATES PATENT AND TRADEMARK OFFICE
CERTIFICATE OF CORRECTION

PATENT NO. : 4,990,859

DATED : February 5, 1991

INVENTOR(S) : BOUYER ET AL.

It is certified that error appears in the above-identified patent and that said Letters Patent is hereby corrected as shown below:

Claim 5, Col. 12, line 20, "of" should be "or".

Signed and Sealed this

Thirtieth Day of June, 1992

Attest:

DOUGLAS B. COMER

Attesting Officer

Acting Commissioner of Patents and Trademarks